(12) United States Patent
Lo et al.

(10) Patent No.: US 10,811,559 B2
(45) Date of Patent: Oct. 20, 2020

(54) METHOD FOR MANUFACTURING INDIUM GALLIUM NITRIDE/GALLIUM NITRIDE QUANTUM-WELL PYRAMID

(71) Applicant: NATIONAL SUN YAT-SEN UNIVERSITY, Kaohsiung (TW)

(72) Inventors: I-Kai Lo, Kaohsiung (TW); Cheng-Da Tsai, Kaohsiung (TW); Ying-Chieh Wang, Kaohsiung (TW); Ming-Chi Chou, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 6 days.

(21) Appl. No.: 16/232,285

(22) Filed: Dec. 26, 2018

(65) Prior Publication Data

US 2020/0203555 A1 Jun. 25, 2020

(30) Foreign Application Priority Data

Dec. 21, 2018 (TW) .............................. 107146512 A (51) Int. Cl.
*H01L 33/00* (2010.01)
*H01L 33/04* (2010.01)
(Continued)

(52) U.S. Cl.
CPC ........ *H01L 33/007* (2013.01); *H01L 21/0254* (2013.01); *H01L 21/02403* (2013.01);
(Continued)

(58) Field of Classification Search
CPC . H01L 33/007; H01L 33/20; H01L 21/02609;
H01L 21/02414; H01L 21/02403; H01L 21/0254; H01L 33/04; H01L 21/02458; H01L 21/02639; H01L 21/02631; H01L 21/02647; H01L 33/06; H01L 21/02389; H01L 27/156;
(Continued)

(56) References Cited

U.S. PATENT DOCUMENTS 9,362,717 B2 6/2016 Kikuchi et al.
9,653,286 B2 5/2017 Ohlsson et al.
(Continued)

FOREIGN PATENT DOCUMENTS

CN 104205294 12/2014
TW I500072 9/2015

*Primary Examiner* — Caleen O Sullivan
(74) *Attorney, Agent, or Firm* — WPAT, PC (57) ABSTRACT

A method for manufacturing an indium gallium nitride/gallium nitride quantum-well pyramid is provided to improve upon the complexity of the conventional method for manufacturing light-emitting diode die. The method for manufacturing an indium gallium nitride/gallium nitride quantum-well pyramid includes performing a first epitaxial reaction and then a second epitaxial reaction on a substrate under 600-650° C. to form a gallium nitride pyramid, growing an first indium gallium nitride layer on an end face of the gallium nitride pyramid, where the end face is away from the substrate, and growing a first gallium nitride layer on the first indium gallium nitride layer. A flux ratio of nitrogen to gallium of the first epitaxial reaction is 25:1-35:1, and a flux ratio of nitrogen to gallium of the second epitaxial reaction is 130:1-150:1.

14 Claims, 9 Drawing Sheets

(51) Int. Cl.
*H01L 33/20* (2010.01)
*H01L 21/02* (2006.01)

(52) U.S. Cl.
CPC .. *H01L 21/02414* (2013.01); *H01L 21/02458* (2013.01); *H01L 21/02609* (2013.01); *H01L 33/04* (2013.01); *H01L 33/20* (2013.01)

(58) Field of Classification Search
CPC . H01L 33/0075; H01L 29/2003; C30B 25/02; C30B 23/02; C23C 16/06; C23C 16/303
USPC ............................................ 438/478; 257/13
See application file for complete search history.

(56) References Cited

U.S. PATENT DOCUMENTS

| | | |
|---|---|---|
| 10,236,178 B2 | 3/2019 | Ohlsson et al. |
| 2014/0110664 A1* | 4/2014 | Lo .................. H01L 27/156 257/13 |
| 2016/0254138 A1 | 9/2016 | Kikuchi et al. |
| 2017/0183776 A1* | 6/2017 | Butcher ................. C30B 25/16 |

* cited by examiner

METHOD FOR MANUFACTURING INDIUM GALLIUM NITRIDE/GALLIUM NITRIDE QUANTUM-WELL PYRAMID

CROSS REFERENCE TO RELATED APPLICATIONS

The application claims the benefit of Taiwan application serial No. 107146512, filed on Dec. 21, 2018, the subject matter of which is incorporated herein by reference.

BACKGROUND OF THE INVENTION

1. Field of the Invention

The present invention generally relates to a method for manufacturing a light-emitting-diode crystal and, more particularly, to a method for manufacturing an indium gallium nitride/gallium nitride quantum-well pyramid.

2. Description of the Related Art

Light-emitting diodes (LEDs) have the advantages of higher luminous intensity, lower energy consumption and lower heat production over traditional lighting elements. Thus, light-emitting diodes are often used as lightings for daily use or light sources for display devices. Group III nitrides (e.g., gallium nitride) are preferred materials of manufacturing light-emitting diode dies, and the light-emitting diode dies made of group III nitrides have good luminous efficiency and good heat conductivity.

Methods such as metal-organic chemical vapor deposition (MOCVD), liquid phase epitaxy (LPE) or molecular beam epitaxy (MBE) are adopted in the conventional method for manufacturing light-emitting diode dies, to fabricate a semiconductive film of group III nitrides on a substrate. The semiconductive film is further divided into a plurality of light-emitting diode dies through a cutting step.

However, in the conventional method for manufacturing light-emitting diode dies, several cutting steps and testing steps are processed to make sure that the plurality of light-emitting diode dies is fabricated into a desired size. In this regard, the conventional method for manufacturing light-emitting diode dies is complicated. Moreover, sizes of the plurality of light-emitting diode dies are still in millimeter scale due to the technical limitation of the cutting steps, which results in the difficulty of improving the resolution of a display device made of the plurality of light-emitting diode dies.

In light of this, it is necessary to improve the conventional method for manufacturing light-emitting diode dies.

SUMMARY OF THE INVENTION

To solve the above problems, one objective of the present invention is to provide a method for manufacturing an indium gallium nitride/gallium nitride quantum-well pyramid having a simplified manufacturing procedure.

Another objective of the present invention is to provide a method for manufacturing an indium gallium nitride/gallium nitride quantum-well pyramid to fabricate a light-emitting diode die of small size.

A further objective of the present invention is to provide a method for manufacturing an indium gallium nitride/gallium nitride quantum-well pyramid to fabricate a light-emitting diode die capable of emitting lights of three primary colors.

A further objective of the present invention is to provide a method for manufacturing an indium gallium nitride/gallium nitride quantum-well pyramid with the success rate of epitaxy increased.

A method for manufacturing indium gallium nitride/gallium nitride quantum-well pyramid according to the present invention includes performing a first epitaxial reaction and then a second epitaxial reaction on a substrate under 600-650° C. to form a gallium nitride pyramid. A flux ratio of nitrogen to gallium of the first epitaxial reaction is 25:1-35:1. A flux ratio of nitrogen to gallium of the second epitaxial reaction is 130:1-150:1. A first indium gallium nitride layer is grown on an end face of the gallium nitride pyramid, where the end face is away from the substrate. A first gallium nitride layer is grown on the first indium gallium nitride layer.

Thus, in the method for manufacturing indium gallium nitride/gallium nitride quantum-well pyramid according to the present invention, the gallium nitride pyramid is grown along a specific direction by applying different flux ratios of nitrogen to gallium in the first epitaxial reaction and the second epitaxial reaction. In this regard, it is able to obtain a single indium gallium nitride/gallium nitride quantum-well pyramid die without a cutting step. The complexity of the manufacturing process is reduced and the convenience of controlling the size of a die is increased.

In an example, the substrate is a $LiAlO_2$ substrate, a $LiGaO_2$ substrate or a ZnO substrate. Thus, the lattice matching between the substrate and other materials is enhanced and the success rate of the manufacturing process is increased.

In an example, a gallium wetting layer is formed on the substrate. The first epitaxial reaction is performed on the gallium wetting layer. Thus, the gallium nitride pyramid can be formed on the gallium wetting layer, which has a material property similar to that of the gallium nitride pyramid. The success rate of epitaxy of the gallium nitride pyramid is increased.

In an example, the first epitaxial reaction and the second epitaxial reaction is performed under 630° C. The flux ratio of nitrogen to gallium of the first epitaxial reaction is 29:1, and the flux ratio of nitrogen to gallium of the second epitaxial reaction is 138.8:1. Thus, the quality of the gallium nitride pyramid is enhanced.

In an example, the first epitaxial reaction is performed for 35 minutes. Thus, it is convenient of controlling the size of the gallium nitride pyramid.

In an example, the second epitaxial reaction is performed for 70 minutes. Thus, it is convenient of controlling the size of the gallium nitride pyramid.

In an example, the first indium gallium nitride layer is grown for 1.5 minutes with a flux ratio of indium to gallium to nitrogen being 1.55:1:165.09 and under 780° C. Thus, the quality of the first indium gallium nitride layer is enhanced.

In an example, an indium wetting layer is formed on the end face, and the first indium gallium nitride layer is grown on the indium wetting layer. Thus, the first indium gallium nitride layer can be formed on the indium wetting layer, which has a material property similar to that of the first indium gallium nitride layer. The success rate of epitaxy of the first indium gallium nitride layer is increased.

The method for manufacturing indium gallium nitride/gallium nitride quantum-well pyramid further includes growing a second indium gallium nitride layer on the first gallium nitride layer after the first gallium nitride layer is grown, growing a second gallium nitride layer on the second indium gallium nitride layer, growing a third indium gallium nitride layer on the second gallium nitride layer, and growing a third gallium nitride layer on the third indium gallium nitride layer. Thus, the luminous efficiency of the indium gallium nitride/gallium nitride quantum-well pyramid is increased.

The present invention will become clearer in light of the following detailed description of illustrative embodiments of this invention described in connection with the drawings.

BRIEF DESCRIPTION OF THE DRAWINGS

FIG. 5 is a photoluminescence spectrum of the sample shown in FIG. 4b and two regions shown in FIG. 4a.

FIG. 8b is a transmission electron microscopy image of the other sample shown in FIG. 8a.

FIG. 8c is a high-angle annular dark-field image of the other sample shown in FIG. 8a.

DETAILED DESCRIPTION OF THE INVENTION

The term "electroluminescence effect" referred to herein means recombination of an electron and an electron hole at a p-n junction of a light-emitting diode to emit lights while a current flows through the p-n junction of the light-emitting diode, which can be appreciated by one having ordinary skill in the art.

The term "wurtzite" referred to herein means a crystal structure of a hexagonal crystal system, with the c-axis of the crystal structure is the [0001] direction of a 4-axis coordinate system, which can be appreciated by one having ordinary skill in the art.

Figure 1:
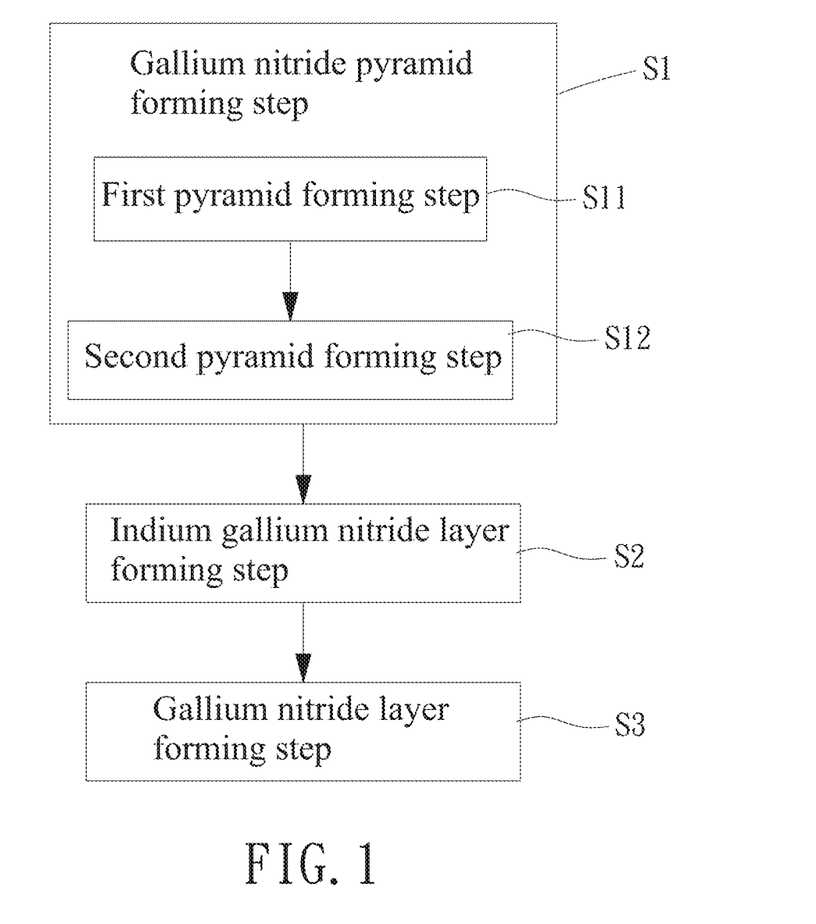
FIG. 1 is a text flowchart illustrating an embodiment of a method according to the present invention.
Figure 2:
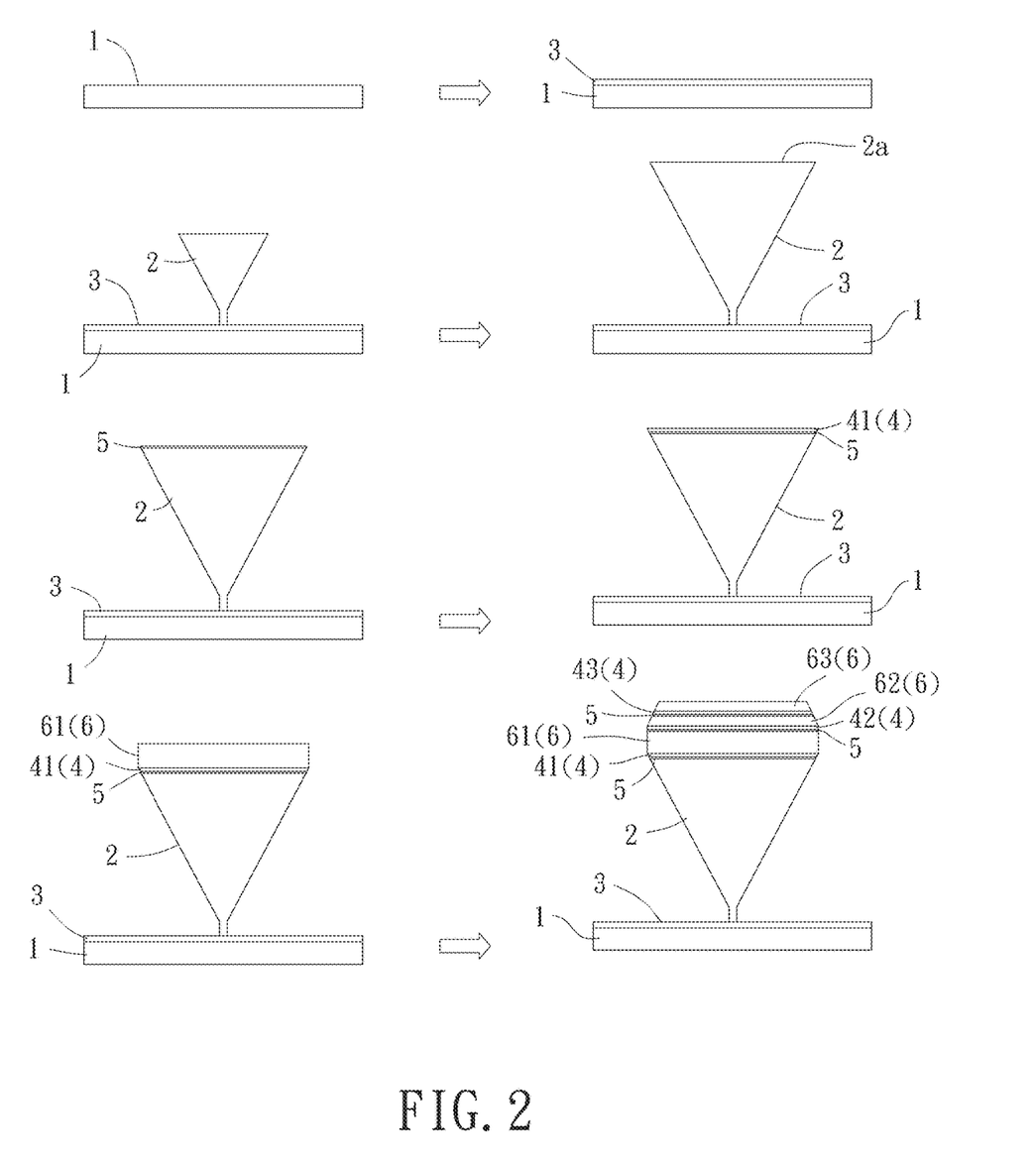
FIG. 2 is a graphic flowchart illustrating the embodiment of the method according to the present invention.

With reference to FIGS. 1-2, a method for manufacturing an indium gallium nitride/gallium nitride quantum-well pyramid includes a gallium nitride pyramid forming step S1, an indium gallium nitride layer forming step S2 and a gallium nitride layer forming step S3. An indium gallium nitride/gallium nitride quantum-well pyramid is fabricated through the above steps.

Before taking the gallium nitride pyramid forming step S1, a substrate 1 for the indium gallium nitride/gallium nitride quantum-well pyramid to grow on can be cleaned to remove impurities on a surface of the substrate 1, so as to enhance the quality of epitaxial product. Specifically, the surface of the substrate 1 can be washed sequentially in acetone, isopropanol, deionized water, phosphoric acid solution and deionized water. The substrate 1 is heated (e.g. heated to 750° C. for 10 minutes) after the liquid on the surface of the substrate 1 is removed by nitrogen gas to assure that the surface of the substrate 1 is clean. The substrate 1 can be a $LiAlO_2$ substrate, a $LiGaO_2$ substrate or a ZnO substrate in order to enhance the lattice matching between the substrate and other materials (e.g. gallium nitride used in the following step) and to increase the success rate of the manufacturing process.

Figure 3:
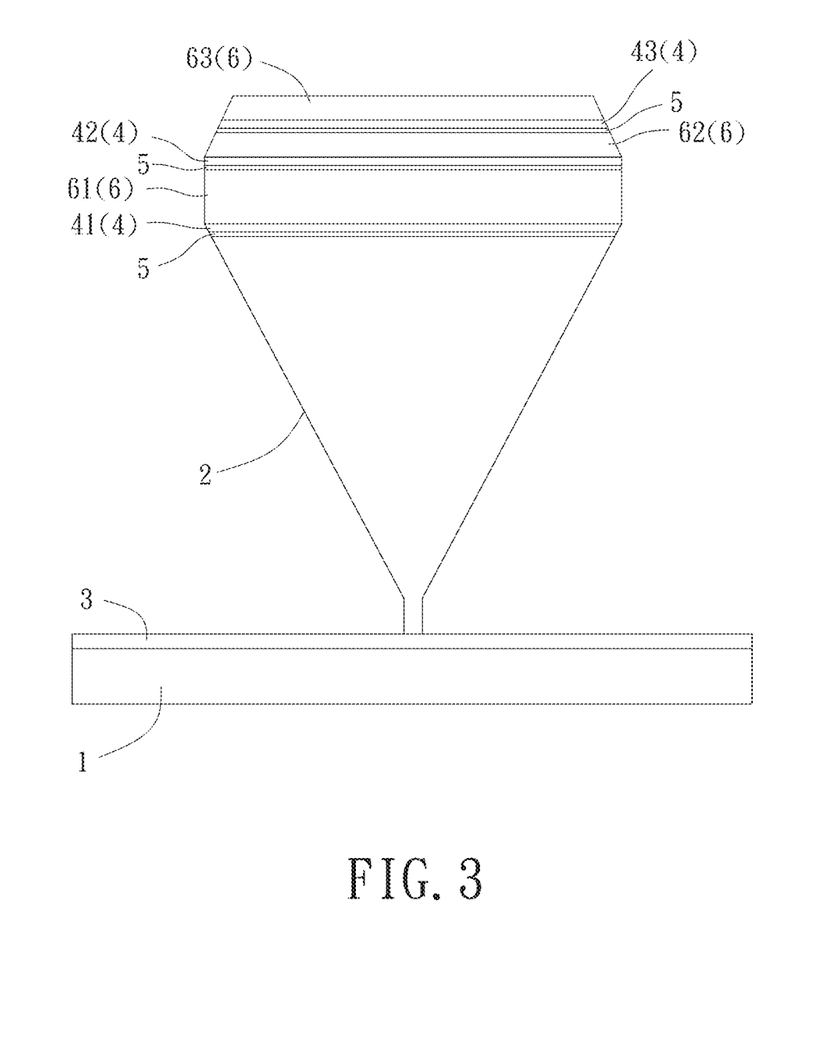
FIG. 3 is a longitudinal sectional view of an indium gallium nitride/gallium nitride quantum-well pyramid made by the embodiment of the method according to the present invention.

With reference to FIGS. 1-3, the gallium nitride pyramid forming step S1 includes a first pyramid forming step S11 and a second pyramid forming step S12, to fabricate a gallium nitride pyramid 2 by the two steps. Therefore, a size of the indium gallium nitride/gallium nitride quantum-well pyramid can be controlled. Specifically, the first pyramid forming step S11 is taken under 600-650° C. to form a semi-finished gallium nitride pyramid on the substrate 1 by performing a first epitaxial reaction on the substrate 1, where a flux ratio of nitrogen to gallium of the first epitaxial reaction is 25:1-35:1. Preferably, the first pyramid forming step S11 can be taken under 630° C., with the flux ratio of nitrogen to gallium of the first epitaxial reaction being 29:1 and the first epitaxial reaction performed for 35 minutes. In this regard, the semi-finished gallium nitride pyramid with good crystal structure can be obtained.

The second pyramid forming step S12 is taken under 600-650° C. to form the gallium nitride pyramid 2 from the semi-finished gallium nitride pyramid by performing a second epitaxial reaction on the substrate 1, where a flux ratio of nitrogen to gallium of the second epitaxial reaction is 130:1-150:1. Preferably, the second pyramid forming step S12 can be taken under 630° C., with the flux ratio of nitrogen to gallium of the second epitaxial reaction being 138.8:1 and the second epitaxial reaction performed for 70 minutes. In this regard, the gallium nitride pyramid 2 with good crystal structure can be obtained. The gallium nitride pyramid 2 includes an end face 2a away from the substrate 1. The end face 2a with a large area is for following epitaxial reactions to be performed on.

In addition, a gallium wetting layer 3 can be formed on the substrate 1, and then the first epitaxial reaction is performed on the gallium wetting layer 3. Due to the similarity of the material property between the gallium wetting layer 3 and gallium nitride for the gallium nitride pyramid 2, the connection between the substrate 1 and the gallium nitride pyramid 2 is enhanced by applying the gallium wetting layer 3 and the success rate of epitaxy of the gallium nitride pyramid 2 is increased. Specifically, the gallium wetting layer 3 can be formed by following steps: providing a vapor containing gallium under 630° C., and depositing gallium elements of the vapor containing gallium on the substrate 1 for 5 minutes to form the gallium wetting layer 3 on the surface of the substrate 1.

The indium gallium nitride forming step S2 is aimed to form an indium gallium nitride layer 4. An epitaxial reaction can be performed for 1.5 minutes under 780° C. with a flux ratio of indium to gallium to nitrogen be 1.55:1:165.09 (for example, the pressure of indium, gallium and nitrogen can be controlled at $8.5\times10^{-8}$, $5.5\times10^{-8}$ and $9.08\times10^{-6}$ Torr, respectively) to form a first indium gallium nitride layer 41.

In addition, an indium wetting layer 5 can be formed on the end face 2a, and then the first indium gallium nitride layer 41 is grown on the indium wetting layer 5. Due to the similarity of the material property between indium wetting layer 5 and indium gallium nitride for the first indium gallium nitride layer 41, the connection between the gallium nitride pyramid 2 and the first indium gallium nitride layer 41 is enhanced by applying the indium wetting layer 5 and the success rate of epitaxy of the first indium gallium nitride layer 41 is increased. Specifically, the indium wetting layer 5 can be formed by following steps: providing a vapor containing indium under 780° C., and depositing indium elements of the vapor containing indium on the end face 2a for 1 minute to form the indium wetting layer 5 on the end face 2a.

The gallium nitride layer forming step S3 is aimed to form a gallium nitride layer 6 on the indium gallium nitride 4. The gallium nitride layer 6 can protect the indium gallium nitride layer 4 and the diffusion of ions into the indium gallium nitride layer 4 is avoided, so the service life of the indium gallium nitride layer 4 is increased. In the gallium nitride layer forming step S3, a gallium nitride epitaxial reaction can be preferably performed with a flux ratio of nitrogen to gallium being 165.09:1 (for example, the pressure of nitrogen and gallium can be controlled at $9.08\times10^{-6}$ and $5.5\times10^{-8}$ Torr, respectively). The gallium nitride epitaxial reaction can be performed for 30 seconds under 780° C. to fabricate a gallium nitride cap layer on the first indium gallium nitride layer 41. Moreover, another gallium nitride epitaxial reaction can be preferably performed with a flux ratio of nitrogen to gallium being 70.39:1 (for example, the pressure of nitrogen and gallium can be controlled at $9.08\times10^{-6}$ and $1.29\times10^{-7}$ Torr, respectively). The other gallium nitride epitaxial reaction can be performed for 10 minutes under 780° C. to fabricate a gallium nitride barrier layer on the gallium nitride cap layer. The gallium nitride cap layer and the gallium nitride barrier layer jointly form a first gallium nitride layer 61. By taking the above steps, the indium gallium nitride/gallium nitride quantum-well pyramid can be obtained, where the indium gallium nitride/gallium nitride quantum-well pyramid includes the gallium nitride pyramid 2, the indium gallium nitride layer 4 and the gallium nitride layer 6.

It is noted that the indium gallium nitride layer 4 can emit lights because of the electroluminescence effect. The color of lights emitted from the indium gallium nitride layer 4 is determined by the element ratio of the indium gallium nitride layer 4. In other words, the indium gallium nitride layer 4 can emit lights with different colors if the element ratio of indium to gallium of the indium gallium nitride layer 4 is changed by adjusting the flux ratio of indium to gallium to nitrogen of the epitaxial reaction in the indium gallium nitride layer forming step S2.

In addition, it is able to fabricate a plurality of indium gallium nitride layers 4 and a plurality of gallium nitride layers 6 on the end face 2a of the gallium nitride pyramid 2 by repeating the indium gallium nitride layer forming step S2 and the gallium nitride layer forming step S3. Thus, the luminous efficiency of the indium gallium nitride/gallium nitride quantum-well pyramid is increased. For example, the indium gallium nitride layer forming step S2 and the gallium nitride layer forming step S3 can be repeated twice after finishing the first time of the indium gallium nitride layer forming step S2 and the gallium nitride layer forming step S3. In this regard, a second and a third indium gallium nitride layers 42, 43 and a second and a third gallium nitride layers 62, 63 are formed, where the second indium gallium nitride 42 layer is on the first gallium nitride layer 61, the second gallium nitride layer 62 is on the second indium gallium nitride layer 42, the third indium gallium nitride layer 43 is on the second gallium nitride layer 62, and the third gallium nitride layer 63 is on the third indium gallium nitride layer 43, in order to form the layered structure shown in FIG. 3.

Take the indium gallium nitride/gallium nitride quantum-well pyramid with the three indium gallium nitride layers 4 for example. By modifying the flux ratio of indium to gallium to nitrogen in the indium gallium nitride layer forming steps S2, the element ratio of indium to gallium among the first, the second and the third indium gallium nitride layers 41, 42, 43 can be different in order for the first, the second and the third indium gallium nitride layers 41, 42, 43 to emit lights with different colors. A red-light indium gallium nitride layer, a green-light indium gallium nitride layer and a blue-light indium gallium nitride layer can be form as the three indium gallium nitride layers 4. Therefore, the three indium gallium nitride layers 4 can emit lights of three primary colors, i.e. the three indium gallium nitride layers 4 can emit red light, green light and blue light. Lights of other colors can be emitted from the indium gallium nitride/gallium nitride quantum-well pyramid by modifying the intensity of the lights of three primary colors. As utilized as display devices, a single indium gallium nitride/gallium nitride quantum-well pyramid can be utilized as a pixel of a display device, and the convenience of utilization of the indium gallium nitride/gallium nitride quantum-well pyramid is enhanced.

The following experiments are carried out to understand the structure and properties of the indium gallium nitride/gallium nitride quantum-well pyramid:

(A) Analysis by Scanning Electron Microscope (SEM)

Figure 4A:
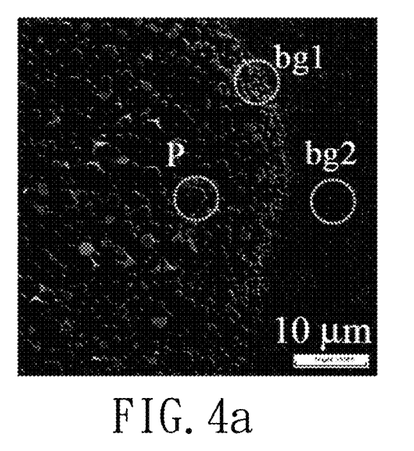
FIG. 4a is a scanning electron microscopy image of a plurality of indium gallium nitride/gallium nitride quantum-well pyramid samples made by the embodiment of the method according to the present invention.
Figure 4B:
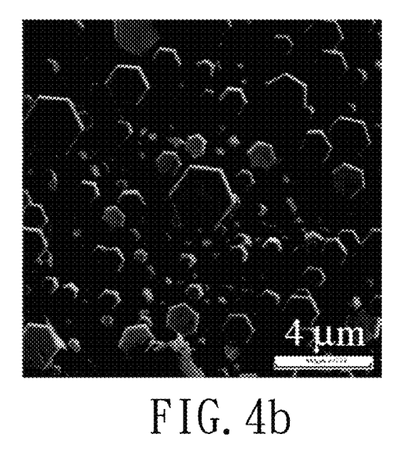
FIG. 4b is a top view of a sample of indium gallium nitride/gallium nitride quantum-well pyramid made by the embodiment of the method according to the present invention.
Figure 4C:
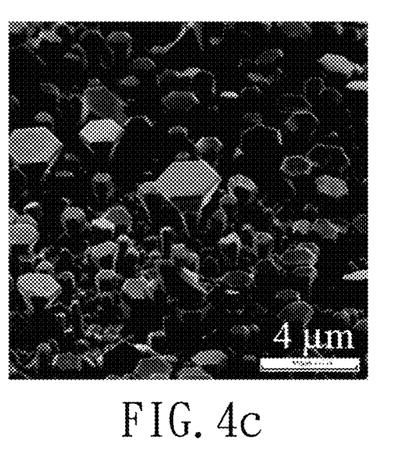
FIG. 4c is a side view of the sample shown in FIG. 4b.
Figure 4D:
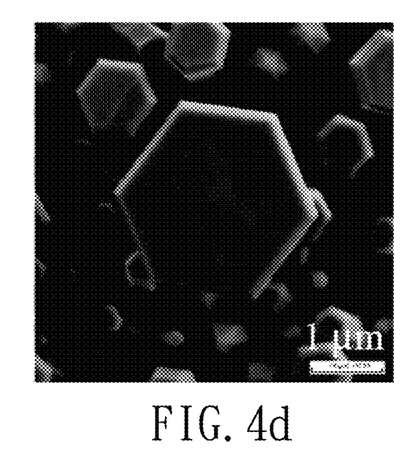
FIG. 4d is a magnified top view the sample shown in FIG. 4b.
Figure 4E:
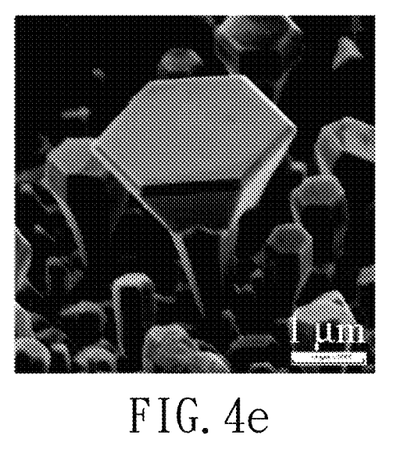
FIG. 4e is a magnified side view the sample shown in FIG. 4b.

FIG. 4a is an SEM image of a plurality of indium gallium nitride/gallium nitride quantum-well pyramid samples on a substrate. A sample P and two regions bg1, bg2 circled with broken lines are taken as the specimen and the background levels for following experiments respectively. The sample P, the region bg1 and the region bg2 are the indium gallium nitride/gallium nitride quantum-well pyramid, a three-dimensional c-plane of a gallium nitride wurtzite structure and a two-dimensional M-plane of the gallium nitride wurtzite structure respectively. FIGS. 4b-4e are magnified images of the sample P, where FIGS. 4b and 4d are top views of the sample P and FIGS. 4c and 4e are side views of the sample P. FIGS. 4b-4e show that the diameter of a top surface of the sample P, which does not connect with the substrate 1, is about 2.9 µm, and that the sample P is in a form of a hexagonal pyramid.

(B) Analysis of Photoluminescence (PL) Spectrum

Figure 5:
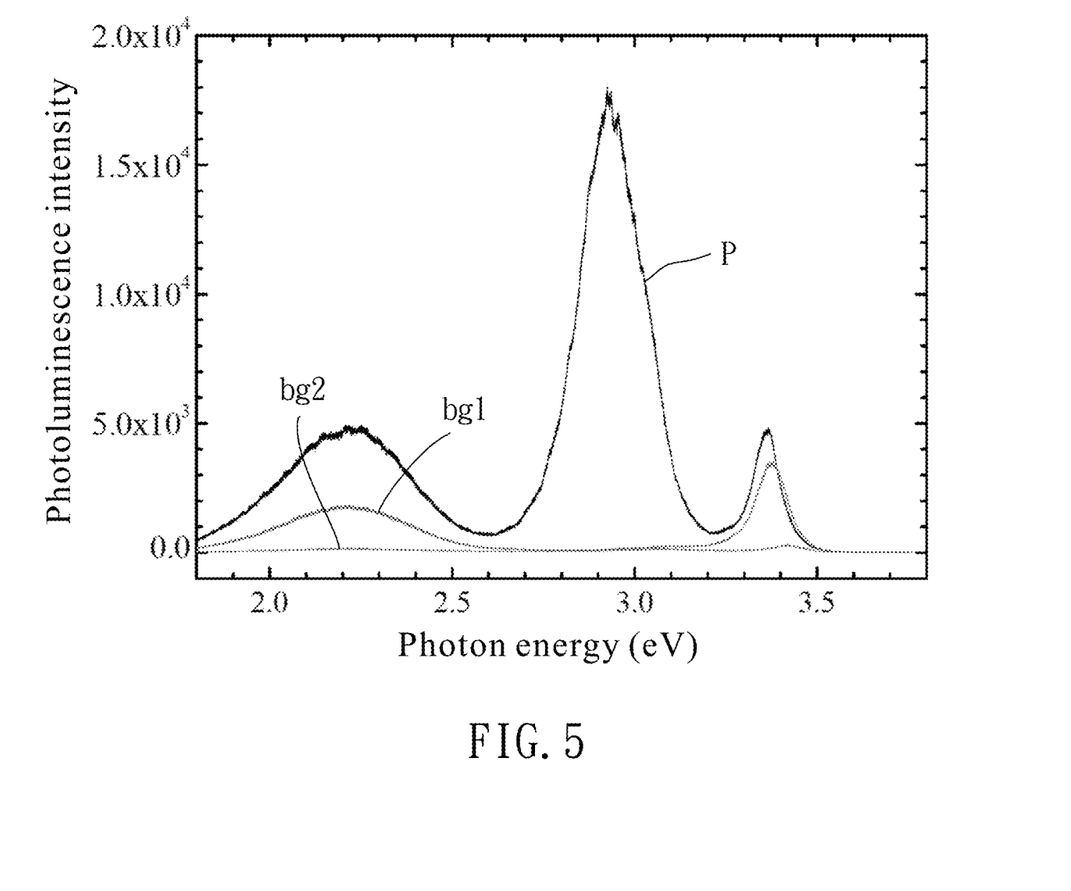

FIG. 5 is a PL spectrum of the sample P and the two regions bg1, bg2. FIG. 5 shows that three peaks are observed from the sample P at photon energy of (2.210±0.001), (2.935±0.001) and (3.359±0.001) eV, two peaks are observed from the region bg1 at photon energy of (2.206±0.001) and (3.373±0.001) eV, and only one peak is observed from region bg2 at photon energy of (3.412±0.002) eV.

Peaks can be observed from the sample P, the region bg1 and the region bg2 when photon energy is 3.359-3.412 eV. The peaks observed at photon energy of 3.359-3.412 eV are attributed to the bandgap transition of the three-dimensional c-plane or the two-dimensional M-plane of the gallium nitride wurtzite structure. The value of the peaks observed from the sample P and the region bg1 at photon energy of 3.359-3.412 eV is less than that from the region bg2 due to the quantum size effect. Rest of peaks from the sample P and the region bg1 will be analyzed by cathodoluminescence (CL) spectroscopy.

(C) Analysis of CL Spectrum and Images

Figure 6:
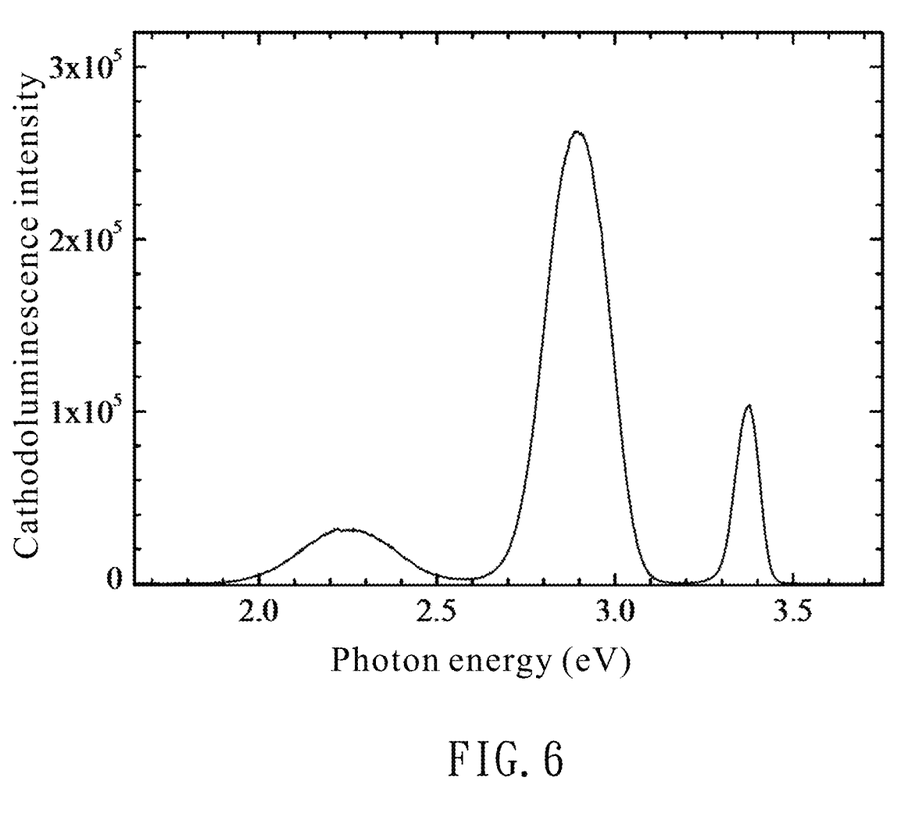
FIG. 6 is a cathodoluminescence spectrum of the sample shown in FIG. 4b.

FIG. 6 is a CL spectrum of the sample P and shows that three peaks are observed from the sample P at photon energy of (2.250±0.002), (2.893±0.003) and (3.371±0.002) eV.

Figure 7A:
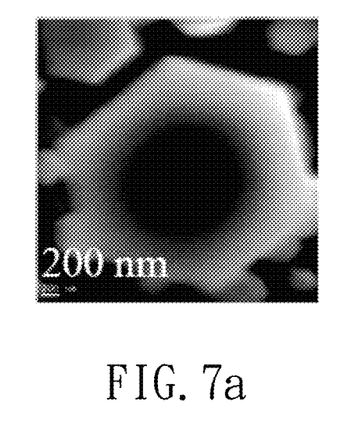
FIG. 7a is a secondary electron image of the sample shown in FIG. 4b.
Figure 7B:
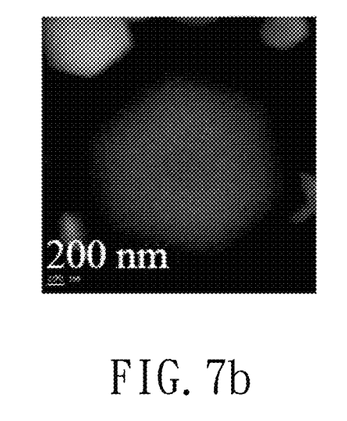
FIG. 7b is a cathodoluminescence image of the sample shown in FIG. 4b at room temperature with photon energy of 3.371 eV.
Figure 7C:
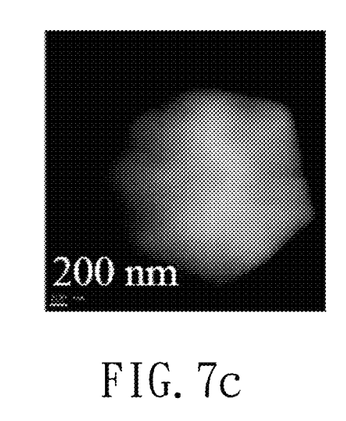
FIG. 7c is a cathodoluminescence image of the sample shown in FIG. 4b at room temperature with photon energy of 2.893 eV.
Figure 7D:
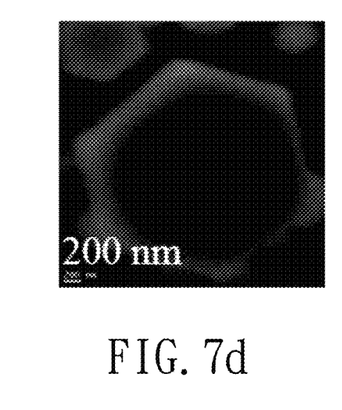
FIG. 7d is a cathodoluminescence image of the sample shown in FIG. 4b at room temperature with photon energy of 2.250 eV.

FIGS. 7a-7d are CL images of the sample P under room temperature. FIG. 7a is a secondary electron image (SEI) of the sample P. FIG. 7b is the CL image of the sample P at photon energy of 3.371 eV (photon wavelength ~336 nm). From FIG. 7b, the peak at photon energy of 3.371 eV is attributed to bandgap transition of gallium nitride crystal with wurtzite structure, and, more particularly, is attributed to bandgap transition of gallium nitride crystals around the sample P. FIG. 7c is the CL image of the sample P at photon energy of 2.893 eV (photon wavelength ~426 nm). From FIG. 7c, the peak at photon energy of 2.893 eV is attributed to bandgap transition of the sample P with three-dimensional c-plane structure. FIG. 7d is the CL image of the sample P at photon energy of 2.250 eV (photon wavelength ~555 nm). From FIG. 7d, the peak at photon energy of 2.250 eV is attributed to bandgap transition or structural defect levels of both the sample P and the gallium nitride crystals around the sample P. From these results, the peak at photon energy of 2.893 eV can be observed only from the sample P with three-dimensional c-plane structure.

Figure 7E:
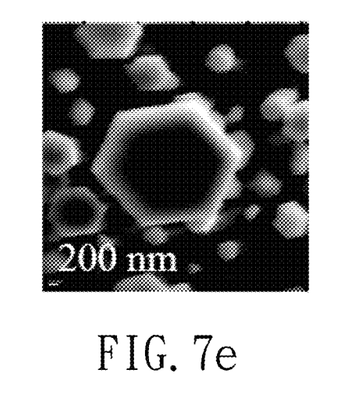
FIG. 7e is a secondary electron image of the sample shown in FIG. 4b at 10 K.
Figure 7F:
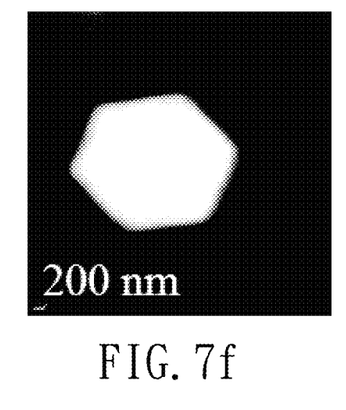
FIG. 7f is a cathodoluminescence image of the sample shown in FIG. 4b at 10 K with photon energy of 2.893 eV.

FIG. 7e is a secondary electron image (SEI) of the sample P under 10 K. FIG. 7f is a CL image of the sample P at photon energy of 2.893 eV under 10 K. FIGS. 7e-7f show that the luminous intensity of the sample P is enhanced due to the quantum confinement effect.

(D) Analysis by Transmission Electron Microscope (TEM)

Figure 8A:
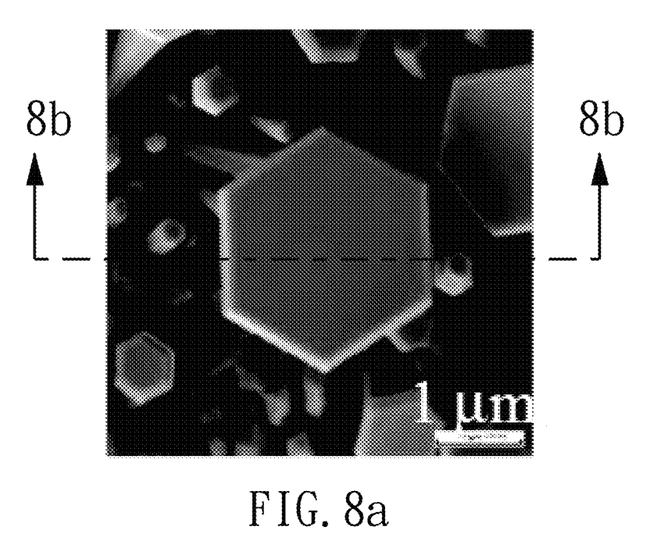
FIG. 8a is a top view of another sample of indium gallium nitride/gallium nitride quantum-well pyramid made by the embodiment according to the present invention.

FIG. 8a is an SEM image of another sample P', where the other sample P' is another indium gallium nitride/gallium nitride quantum-well pyramid. FIGS. 8b-8h are TEM images of the other sample P' shown in FIG. 8a, and FIGS. 8b-8h are taken of a longitudinal section of the other sample P' divided along the 8b-8b line in FIG. 8a. FIGS. 8b-8h are observed along a [1$\bar{1}$00] direction.

Figure 8B:
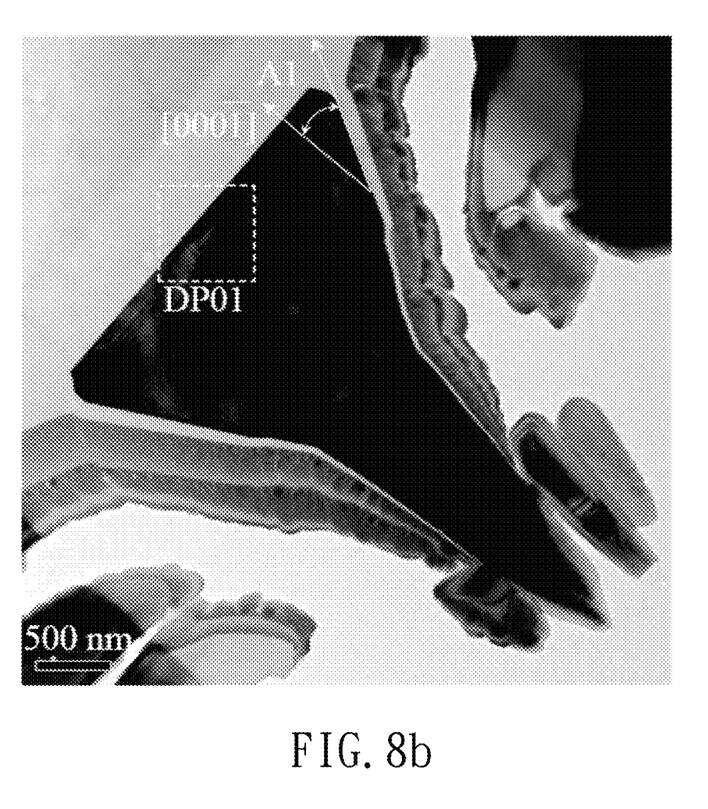

FIG. 8b shows that, the gallium nitride pyramid of the other sample P' has lateral faces. The angle Al between each of the lateral faces and the c-axis of the 4-axis coordinate system is about 28°. The gallium nitride pyramid is grown into a form of an awl because of the lateral overgrowth of the epitaxial reactions. Specifically, the nitrogen atoms are caught by the edged gallium atoms during the epitaxial reactions, and thus make the gallium nitride pyramid into the form of the awl.

Figure 8C:
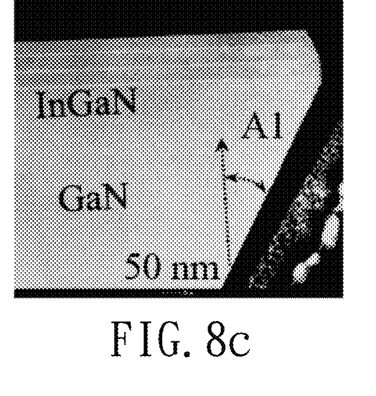

FIG. 8c is the high-angle annular dark-field (HAADF) image of the other sample P'. FIG. 8c shows that the three indium gallium nitride layers are grown on the end face of the gallium nitride pyramid entirely. Furthermore, the three indium gallium nitride layers cannot hold the 28°-angle divergent growth due to the micro-fluctuation of lattice-mismatch between In and Ga atoms, and thus the lateral faces of the three indium gallium nitride layers and the three gallium nitride layers are parallel or convergent to the c-axis.

Figure 8D:
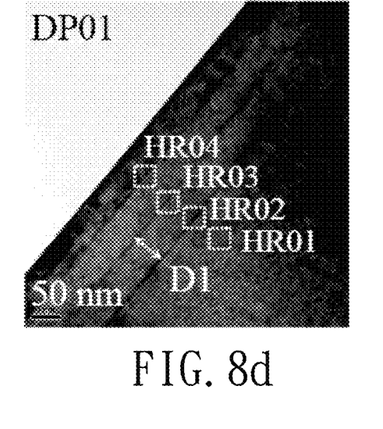
FIG. 8d is a magnified transmission electron microscopy image of a region DP01 as shown in FIG. 8b.
Figure 8E:
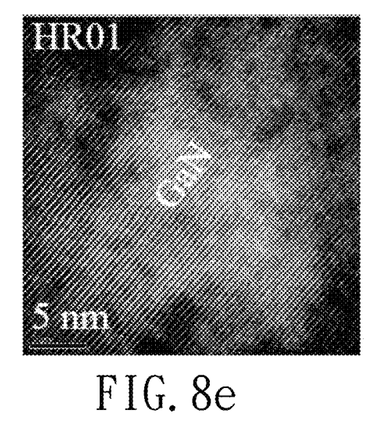
FIG. 8e is a magnified transmission electron microscopy image of a region HR01 as shown in FIG. 8d.
Figure 8F:
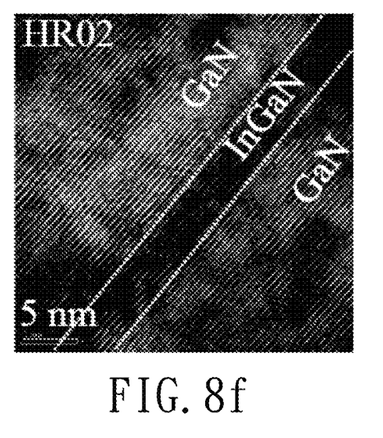
FIG. 8f is a magnified transmission electron microscopy image of a region HR02 as shown in FIG. 8d.
Figure 8G:
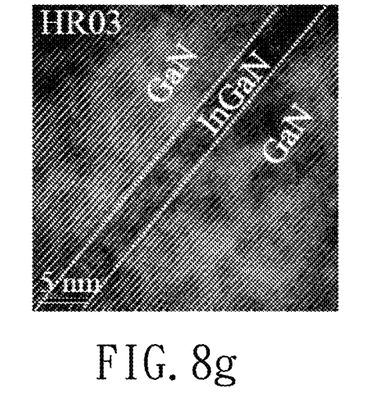
FIG. 8g is a magnified transmission electron microscopy image of a region HR03 as shown in FIG. 8d.
Figure 8H:
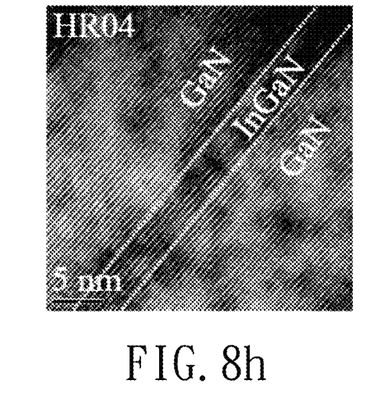
FIG. 8h is a magnified transmission electron microscopy image of a region HR04 as shown in FIG. 8d.

FIG. 8d is a magnified image of region DP01 in FIG. 8b. It is measured that a distance D1 between two of the three indium gallium nitride layers is 57.6 nm in FIG. 8d. FIGS. 8e-8h are magnified images of region HR01-HR04 respectively. Periodically aligned wurtzite structure of the gallium nitride pyramid is observed in FIG. 8e. In FIGS. 8f-8h, it is observed that one of the three indium gallium nitride layers is formed between the gallium nitride pyramid and one of the three gallium nitride layers, or between two of the three gallium nitride layers.

In view of the foregoing, in the method for manufacturing indium gallium nitride/gallium nitride quantum-well pyramid according to the present invention, the gallium nitride pyramid is grown along a specific direction by applying different flux ratios of nitrogen to gallium in the first epitaxial reaction and the second epitaxial reaction. In this regard, it is able to obtain a single indium gallium nitride/gallium nitride quantum-well pyramid die without a cutting step. The complexity of the manufacturing process is reduced and the convenience of controlling the size of a die is increased.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A method for manufacturing indium gallium nitride/gallium nitride quantum-well pyramid, comprising:
   performing a first gallium nitride epitaxial reaction and then a second gallium nitride epitaxial reaction on a substrate under 600-650° C. to form a gallium nitride pyramid, wherein a flux ratio of nitrogen to gallium of the first epitaxial reaction is 25:1-35:1, wherein a flux ratio of nitrogen to gallium of the second epitaxial reaction is 130:1-150:1;
   growing a first indium gallium nitride layer on an end face of the gallium nitride pyramid, wherein the end face is away from the substrate; and
   growing a first gallium nitride layer on the first indium gallium nitride layer.

2. The method for manufacturing indium gallium nitride/gallium nitride quantum-well pyramid as claimed in claim 1, wherein the substrate is a LiAlO$_2$ substrate, a LiGaO$_2$ substrate or a ZnO substrate.

3. The method for manufacturing indium gallium nitride/gallium nitride quantum-well pyramid as claimed in claim 1, wherein a gallium wetting layer is formed on the substrate, and wherein the first gallium nitride epitaxial reaction is performed on the gallium wetting layer.

4. The method for manufacturing indium gallium nitride/gallium nitride quantum-well pyramid as claimed in claim 1, wherein the first gallium nitride epitaxial reaction and the second gallium nitride epitaxial reaction is performed under 630° C., wherein the flux ratio of nitrogen to gallium of the first epitaxial reaction is 29:1, and wherein the flux ratio of nitrogen to gallium of the second epitaxial reaction is 138.8:1.

5. The method for manufacturing indium gallium nitride/gallium nitride quantum-well pyramid as claimed in claim 4, wherein the first gallium nitride epitaxial reaction is performed for 35 minutes.

6. The method for manufacturing indium gallium nitride/gallium nitride quantum-well pyramid as claimed in claim 4, wherein the second gallium nitride epitaxial reaction is performed for 70 minutes.

7. A method for manufacturing indium gallium nitride/gallium nitride quantum-well pyramid comprising:
   forming a gallium nitride pyramid on a substrate, by sequentially performing a first gallium nitride epitaxial reaction and a second gallium nitride epitaxial reaction on a substrate under 600-650° C., wherein the gallium nitride pyramid has an end face away from the substrate, wherein a flux ratio of nitrogen to gallium of the first epitaxial reaction is 25:1-35:1, wherein a flux ratio of nitrogen to gallium of the second epitaxial reaction is 130:1-150:1;
   growing a first indium gallium nitride layer on the end face of the gallium nitride pyramid, by performing a indium gallium nitride epitaxial reaction under 780° C. for 1.5 minutes with a flux ratio of indium to gallium to nitrogen being 1.55:1:165.09;
   forming a gallium nitride cap layer on the indium gallium nitride layer, by performing a third gallium nitride epitaxial reaction under 780° C. for 30 seconds with a flux ratio of nitrogen to gallium being 165.09:1; and
   forming a gallium nitride barrier layer on the gallium nitride cap layer, by performing a fourth gallium nitride epitaxial reaction under 780° C. for 10 minutes with a flux ratio of nitrogen to gallium being 70.39:1.

8. The method for manufacturing indium gallium nitride/gallium nitride quantum-well pyramid as claimed in claim 7, wherein an indium wetting layer is formed on the end face, and wherein the first indium gallium nitride layer is grown on the indium wetting layer.

9. The method for manufacturing indium gallium nitride/gallium nitride quantum-well pyramid as claimed in claim 7, further comprising growing a second indium gallium nitride layer on the first gallium nitride layer after the first gallium nitride layer is grown, growing a second gallium nitride layer on the second indium gallium nitride layer, growing a third indium gallium nitride layer on the second gallium nitride layer, and growing a third gallium nitride layer on the third indium gallium nitride layer.

10. The method for manufacturing indium gallium nitride/gallium nitride quantum-well pyramid as claimed in claim 7, wherein the substrate is a $LiAlO_2$ substrate, a $LiGaO_2$ substrate or a ZnO substrate.

11. The method for manufacturing indium gallium nitride/gallium nitride quantum-well pyramid as claimed in claim 7, wherein a gallium wetting layer is formed on the substrate, and wherein the first gallium nitride epitaxial reaction is performed on the gallium wetting layer.

12. The method for manufacturing indium gallium nitride/gallium nitride quantum-well pyramid as claimed in claim 7, wherein the first gallium nitride epitaxial reaction and the second gallium nitride epitaxial reaction is performed under 630° C., wherein the flux ratio of nitrogen to gallium of the first epitaxial reaction is 29:1, and wherein the flux ratio of nitrogen to gallium of the second epitaxial reaction is 138.8:1.

13. The method for manufacturing indium gallium nitride/gallium nitride quantum-well pyramid as claimed in claim 12, wherein the first gallium nitride epitaxial reaction is performed for 35 minutes.

14. The method for manufacturing indium gallium nitride/gallium nitride quantum-well pyramid as claimed in claim 12, wherein the second gallium nitride epitaxial reaction is performed for 70 minutes.

* * * * *